(12) United States Patent
Steiner

(10) Patent No.: US 7,977,973 B2
(45) Date of Patent: Jul. 12, 2011

(54) ELECTRONIC BASIC UNIT FOR A SYSTEM ON CHIP

(75) Inventor: Markus Steiner, Ulrich (AT)

(73) Assignee: Infineon Technologies AG, Munich (DE)

(*) Notice: Subject to any disclaimer, the term of this patent is extended or adjusted under 35 U.S.C. 154(b) by 633 days.

(21) Appl. No.: 11/298,545

(22) Filed: Dec. 9, 2005

(65) Prior Publication Data

US 2006/0151876 A1    Jul. 13, 2006

(30) Foreign Application Priority Data

Dec. 10, 2004    (DE) .......................... 10 2004 059 673

(51) Int. Cl.
*H03K 19/173* (2006.01)
(52) U.S. Cl. ......................................... 326/47; 326/101
(58) Field of Classification Search .............. 326/37–47, 326/101
See application file for complete search history.

(56) References Cited

U.S. PATENT DOCUMENTS

| 4,779,231 | A  |   | 10/1988 | Holzapfel et al. |
| 5,512,765 | A  | * | 4/1996  | Gaverick ...................... 257/202 |
| 6,300,793 | B1 | * | 10/2001 | Ting et al. ........................ 326/41 |
| 6,531,889 | B1 | * | 3/2003  | Leitch .............................. 326/39 |
| 6,798,239 | B2 | * | 9/2004  | Douglass et al. ................ 326/39 |
| 6,971,004 | B1 | * | 11/2005 | Pleis et al. ...................... 713/100 |

FOREIGN PATENT DOCUMENTS

| EP | 0683 524 A1 | 5/1995 |
| EP | 0871 223 A1 | 12/1996 |

* cited by examiner

*Primary Examiner* — James Cho
(74) *Attorney, Agent, or Firm* — Maginot, Moore & Beck

(57) ABSTRACT

An electronic basic unit for a system on chip comprises a semiconductor substrate and an area on the semiconductor substrate. The area is bounded by a geometric basic shape and the electronic basic unit is formed on the semiconductor substrate and has the form of an integrated circuit. The electronic basic unit further comprises a functional circuit core which determines a function for the electronic basic unit and at least one connecting port at the edges of the geometric basic shape. The at least one connecting port is designed to be coupled to a further connecting port of a further electronic basic unit produced on the semiconductor substrate and being adjacent to the electronic basic unit. The electronic basic unit comprises also a programmable connecting-port controller for controlling data transfers between the electronic basic unit and the further electronic basic unit produced on the semiconductor substrate via the at least one connecting port.

14 Claims, 5 Drawing Sheets

ELECTRONIC BASIC UNIT FOR A SYSTEM ON CHIP

BACKGROUND OF THE INVENTION

1. Field of the Invention

The present invention relates to an electronic basic unit or a functional module for use in a system on chip. The invention also relates to an exposure-mask arrangement for photolithographically producing the inventive electronic basic unit, to a system on chip comprising inventive electronic basic units and to a corresponding production method.

2. Description of the Related Art

A system on chip (SoC) refers to when complete systems comprising microprocessors, memories, communication interfaces and/or digital and analogue circuit parts, for example, are integrated on a single semiconductor chip. SoCs then meet the demands on reliability, dimensions and low energy requirement at a high processing speed and a relatively low price. The large-scale integration of such circuits on a single semiconductor substrate by combining all the system components on one chip results in the fields of use for such an SoC being restricted, however. This is because it is possible to use only the ones which are produced as a system function by the SoC development.

To provide flexible and user-adaptable solutions, what are known as ASICs (Application Specific Integrated Circuits) were developed. Gate arrays, for example, contain regular arrangements of digital basic elements which can be manufactured in advance in large quantities as "masters". Connections between the cells or the wiring for the integrated circuit can then be programmed in the production process using masks, for example. The masks are then produced for the last technologically required planes and the preparation of the circuit is thus finished. The relatively high level of flexibility in the field of application of such gate arrays is bought at the cost of a high area requirement and power consumption, however.

In addition, what are known as "field-programmable gate arrays" (FPGAs) are known which are fully programmable by the user. In order to be appropriate for a large number of instances of use and system requirements, these need to have a large number of universal structures comprising gates and logic elements. This means that although FPGAs can be used flexibly they have an even higher area requirement than mask-programmable gate arrays and a high energy requirement. FPGAs are particularly suitable for very small quantities, where it is not economical to integrate the system function on a chip fully.

On the other hand, fully integrated SoCs cannot be modified once mask production has ended. If changes are to be made to an existing design for an SoC, then although the design phase allows the use of macros for electronic basic units in the SoC in a description language or in a form of checked layout data again it is necessary to carry out full mask production for the photolithographic process again. Particularly the production of such mask sets is very expensive.

SUMMARY OF THE INVENTION

It is an object of the present invention to provide electronic basic units for use in systems on chip which allow modification of the SoC without needing to produce a full mask set again.

The object is achieved in accordance with the invention by means of an electronic basic unit for a system on chip:

a) which is in the form of an integrated circuit on a semiconductor substrate;
b) which comprises an area on the semiconductor substrate which is bounded by a geometric basic shape;
c) with a functional circuit core which determines a function for the electronic basic unit;
d) which has, at the edges of the geometric basic shape, at least one connecting port which can be coupled to a connecting port on a directly adjacent electronic basic unit which is produced on the same semiconductor substrate; and
e) having a programmable connecting-port controller for controlling data transfers between the electronic basic unit further electronic basic units on the semiconductor substrate via the connecting ports.

Accordingly, the invention provides an electronic basic unit for a system on chip which is in the form of an integrated circuit on a semiconductor substrate; which comprises an area on the semiconductor substrate which is bounded by a geometric basic shape; which has a functional circuit core which determines a function for the electronic basic unit; which has, at the edges of the geometric basic shape, at least one connecting port which couples to a connecting port on a directly adjacent electronic basic unit which is produced on the same semiconductor substrate; and which is equipped with a programmable connecting-port controller for controlling data transfers between the electronic basic unit and further electronic basic units produced on the semiconductor substrate via the connecting ports.

A fundamental inventive idea is that the electronic basic unit takes up a standardized area and can communicate with directly adjacent basic units or modules via the connecting ports. This makes any systems on chip easily possible using a prescribed number of adjacent basic units which are produced on a semiconductor substrate and which have different functional circuit cores. By providing a library of inventive electronic basic units, it is possible to produce and modify any systems on chip inexpensively without redeveloping exposure masks for the entire system again. The invention allows modular design of SoCs at mask level.

Preferably, the geometric basic shape may be chosen such that an area on the semiconductor substrate can be inlaid with the geometric basic shape. Regular coverage comprising identical, geometric basic shapes affords efficient utilization of the semiconductor substrate area. The geometric basic shape is preferably a rectangle, but may also have other geometries, such as squares, triangles or other shapes. Single electronic basic units may also comprise multiples of the geometric basic shape, provided that the semiconductor substrate area is covered and the inventive connecting ports of adjacent electronic basic units engage in one another.

Preferably, at least one connecting port may be provided on each side of a geometric basic shape which is chosen to be a rectangle.

In a restricted version of the inventive electronic basic unit, a peripheral interface having connection pads for connection to external electronic circuits is provided. Electronic basic units of such a design thus allow connections to be routed out at the edge of the entire SoC, for example, which is designed from inventive electronic basic units.

In a further restricted version of the inventive electronic basic unit, it contains an internal clock generator. This makes the basic units extremely dependent and means that they can communicate with one another via the connecting ports, for example using an asynchronous protocol.

In a further restricted version of the inventive electronic basic unit, the connecting-port controller in the electronic basic unit connects incoming data to the functional circuit core or to a further connecting port on the same electronic basic unit. A preferred connecting-port controller of this type thus allows data to be transported over a plurality of electronic basic units in an SoC.

The connecting-port controller may have a memory for holding connection data. These connection data contain relative destination addresses, for example, to which data are intended to be transmitted from one electronic basic unit to another.

In further restricted version of the inventive electronic basic unit, the functional circuit core is in the form of a microprocessor, a memory, a digital signal processor, an analogue/digital converter or a digital/analogue converter.

Since the functional circuit core defines the desired system function of the basic unit, such preferred forms of the circuit cores can be used to construct almost any systems on chip and to perform many kinds of flexible system tasks.

The object is also achieved in accordance with the invention by means of an exposure mask arrangement for photolithographically producing a single inventive electronic basic unit. In this case, the exposure mask arrangement preferably has individual exposure masks for layer-by-layer exposure and formation of the electronic basic unit on the semiconductor substrate. Such inventive exposure mask arrangements allow an entire system on chip to be put together from the electronic basic units in practice. In this case, it is advantageous to provide aligning means, such as cross hairs, at the edges of the exposure masks in order to produce directly adjacent electronic basic units with an exact fit and to ensure precise coverage of the semiconductor substrate.

The object is also achieved in accordance with the invention by means of a method for producing a system on chip is provided with the following method steps:
(a) a semiconductor substrate and inventive exposure-mask arrangements are provided;
(b1) the semiconductor substrate is exposed to light using an exposure mask for a first electronic basic unit;
(b2) the semiconductor substrate is exposed to light using a second exposure mask for a second electronic basic unit;
(c) the entire semiconductor substrate is processed to form a first layer of the first and second electronic basic units;
(d) steps (b1)-(c) are performed with further exposure masks for the electronic basic units to form the complete system on chip.

The inventive production method using the inventive exposure mask arrangements for forming a system on chip has the great advantage that when system requirements are changed it is merely necessary to exchange individual mask arrangements for electronic basic units. In contrast to this, producing SoCs based on the prior art requires complete redesign of an entire exposure mask arrangement for the entire system on chip. By contrast, the inventive method involves the SoC being created layer by layer by inlaying the semiconductor support with the electronic basic units, it being possible to change individual basic units easily by exchanging the appropriate exposure mask arrangement. Accordingly, just one library of exposure mask arrangements for the electronic basic units is required. This avoids costly re-production and redesign of masks.

The invention also provides a system on chip comprising a plurality of inventive electronic basic units, where the electronic basic units on a common semiconductor substrate are in a form such that the edges of adjacent electronic basic units and their connecting ports couple to one another. Preferably, the connecting ports and connecting-port controllers then form an orthogonal bus system for the system on chip. If the geometric basic shape is chosen to be square, the arrangements of the respective connecting ports, for example in the centre of each side of the corresponding square, together with the connecting-port controllers form a grid. Preferably, the connecting ports are then in one plane of the system on chip which is formed.

In one possible embodiment of the inventive system on chip, common power supply lines are provided in one plane of the system on chip for the electronic basic units. It is thus first of all possible to provide a grid comprising the power supply lines on the substrate, for example, and then the electronic basic units are formed and supplied with power.

Further preferred embodiments and developments of the invention are the subject matter of the subclaims and the description of preferred exemplary embodiments with reference to the figures.

DESCRIPTION OF THE PREFERRED EMBODIMENTS

In the figures, elements which are the same or have the same function are respectively denoted by the same reference symbols.

Figure 1:
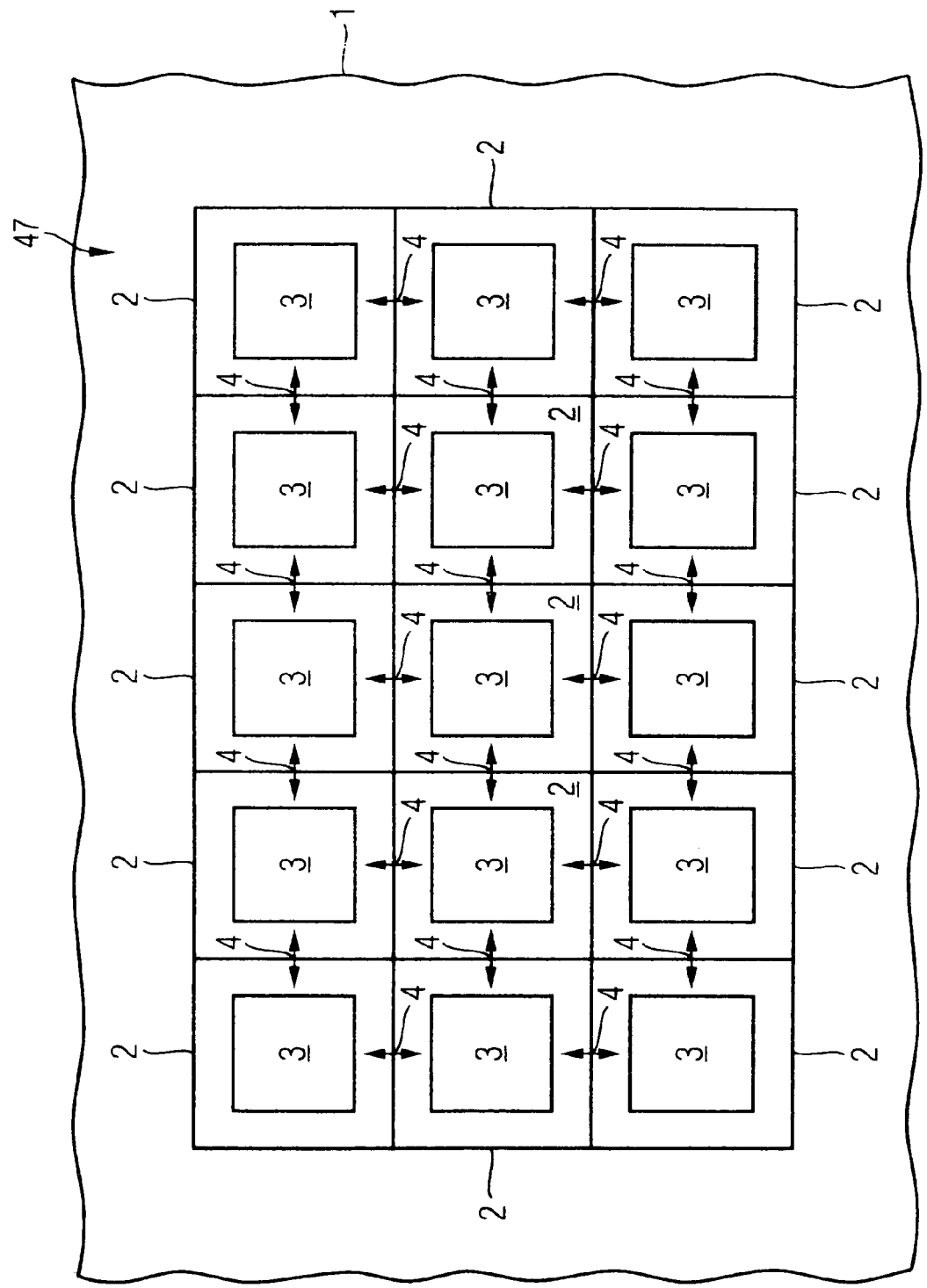
FIG. 1 is a schematic illustration of inventive electronic basic units.

FIG. 1 shows a schematic illustration of inventive electronic basic units.

A semiconductor substrate 1 is provided which, in this exemplary instance, has fifteen inventive electronic basic units 2 shown on it. The electronic basic units 2 are designed to have a square basic shape and each have a functional circuit core 3.

The edges of the squares which respectively bound the electronic basic units nestle directly into one another in the case of adjacent basic units 2. In addition, the electronic basic units 2 have connecting ports 4 which connect adjacent basic units 2 to one another. A connecting port is understood to be a total number of couplable data and control lines in the basic unit for sending and receiving appropriate signals to and from further connecting ports which are coupled thereto. The total number of the electronic basic units thus forms a system on chip 47. The communication and data transfer between the electronic basic units will become clearer after a detailed description of a connecting-port controller, which is provided in each basic unit 2.

Figure 2:
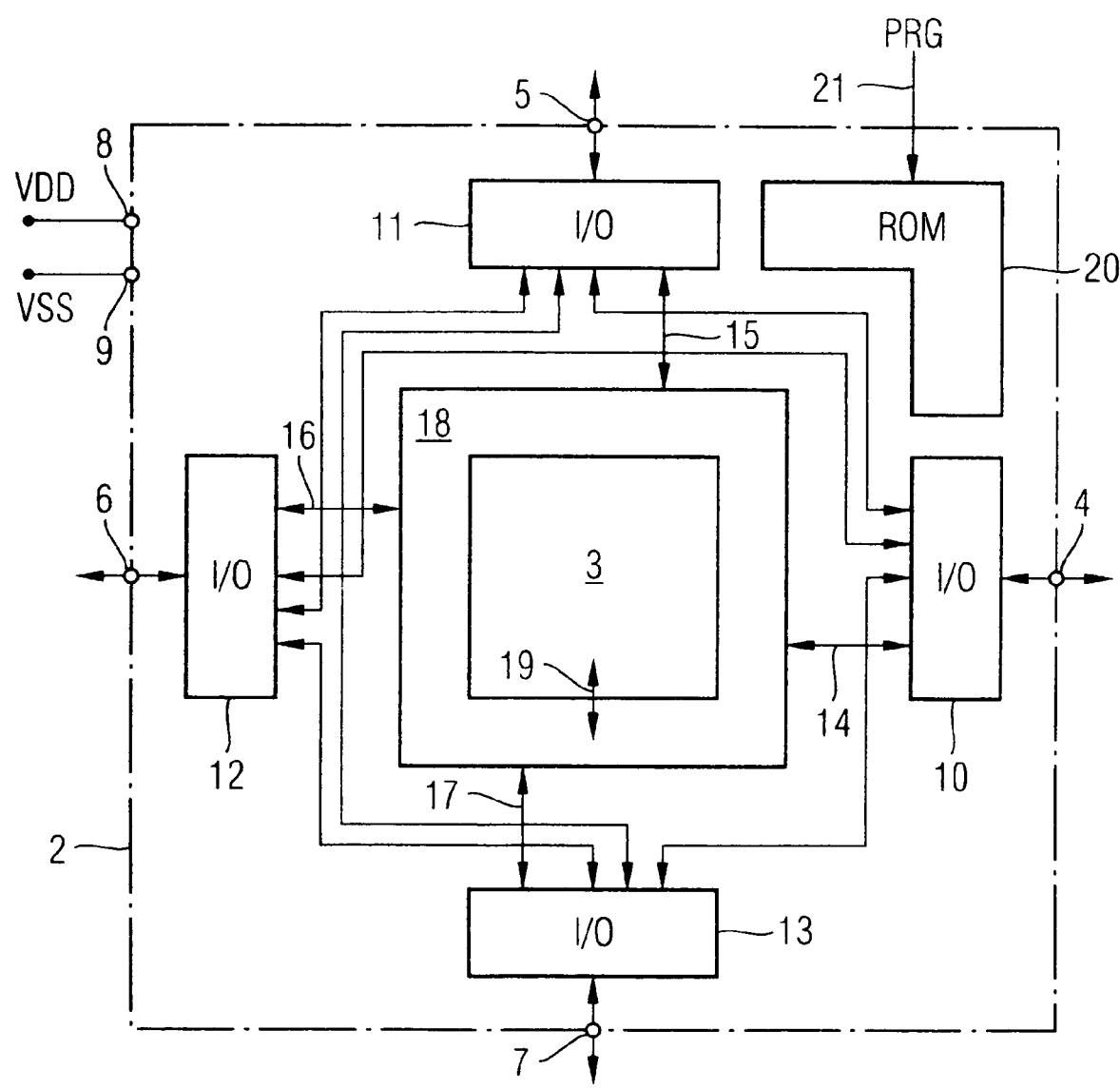
FIG. 2 is a block diagram of an inventive electronic basic unit.

FIG. 2 shows a block diagram of an electronic basic unit 2.

The basic unit 2 is likewise of square design and has a connecting port 4, 5, 6, 7 in the centre of each side. The electronic basic unit also has supply voltage connections 8, 9 for supplying energy using supply voltages VDD, VSS.

Each of the four connecting ports 4, 5, 6, 7 has a port control unit 10, 11, 12, 13 connected to it. Each of the port control units 10, 11, 12, 13 is connected via port lines 14, 15, 16, 17 to a port control unit 18, which represents an interface to the functional circuit core 3. Port lines are suitable for transmitting signals which are present on the ports. This core interface 18 and the functional circuit core 3 are again connected via port lines 19. The port lines 14-17, 19 may comprise address, data and control lines, for example. In addition, each port control unit 10-13 is connected to the other three port control units 10-13 via such port lines, which are not denoted in more detail here.

The electronic basic unit 2 also has a memory 20 which may be in programmable form, for example using programming lines 21. The memory 20 holds connection data which provide the connecting-port controller with information from the port control units and the internal port lines regarding how data are interchanged between various electronic basic units 2, as illustrated in FIG. 1, for example. The memory 20 may, for example, be in the form of a non-volatile ROM store or else may be programmed via external programming lines 21 which are provided. The memory may also be programmed permanently in hardware when an overall SoC is produced.

In the case of the exemplary embodiment under consideration here, the electronic basic units 2 shown in FIG. 1 cover an area of the semiconductor substrate 1 and form the overall system on chip 47. The connecting ports 4 which coupled to one another, together with the connecting-port controller, thus form an orthogonal bus system. Address allocation can be performed in the form of X and Y coordinates in horizontal and vertical directions, for example.

To set up a data link between non-adjacent electronic basic units 2, a relative target address is stipulated from the start basic unit to the destination basic unit and controls the connection setup or data transport. The port control units 10-13 are designed to do this, as illustrated in FIG. 3.

Figure 3:
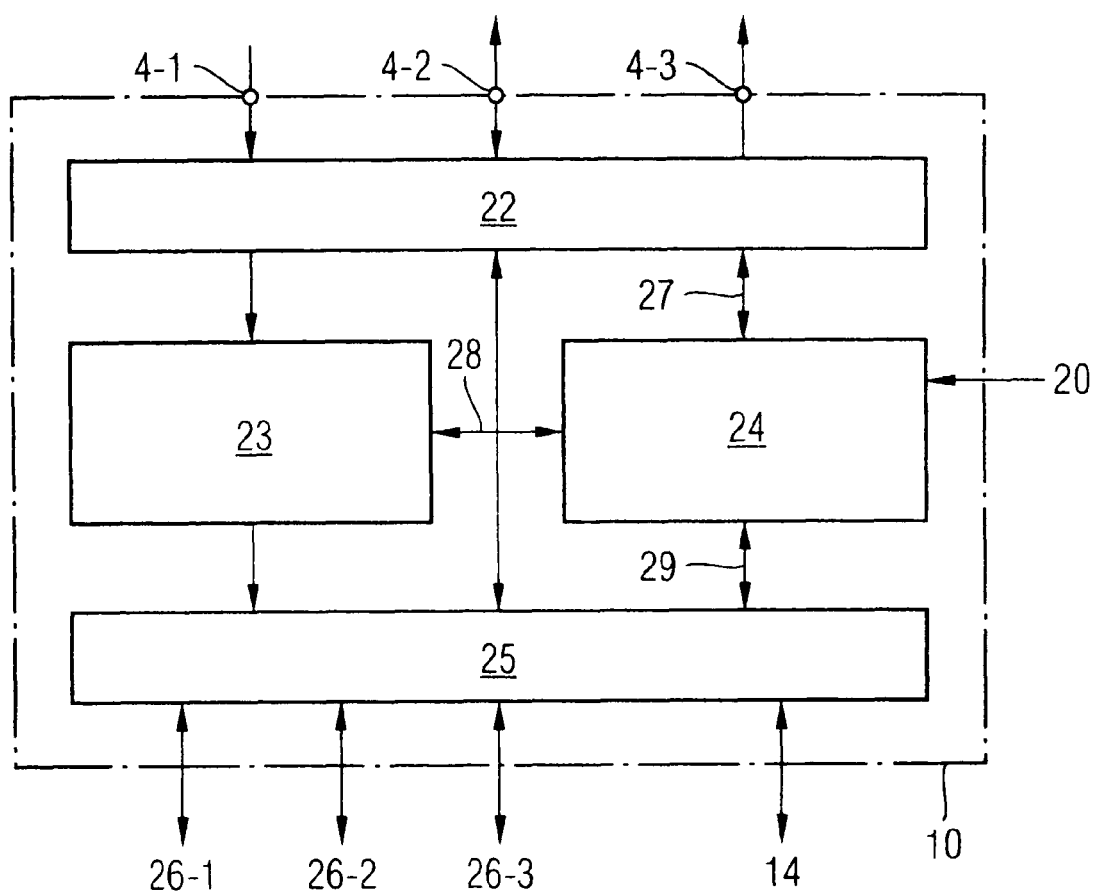
FIG. 3 is a block diagram of an inventive connecting-port controller.

FIG. 3 shows a port control unit 10 by way of example, with a driver unit 22, an address-matching unit 23, a control unit 24 and a multiplexer arrangement 25. The driver unit 22 is coupled to the connecting port 4-1, 4-2, 4-3 via port lines. The port lines are suitable for receiving address and data input information (4-1), handshake signals (4-2) and address and data output signals (4-3). The multiplexer arrangement 25 is coupled via port lines 14 to the port control unit 18, which serves as an interface for the functional circuit core 3. The multiplexer arrangement 25 is also coupled to the three remaining port control units 11, 12, 13 via further port lines 26-1, 26-2, 26-3.

The address-matching unit 23 is connected to the driver unit 22 and the multiplexer arrangement 25. In addition, the control unit 24 is coupled to the driver unit 22, the address-matching unit 23 and the multiplexer arrangement 29 via control lines 27, 28, 29 in order to control the data transfer. The driver unit 22 is also connected directly to the multiplexer arrangement 25. The control unit 10 can receive sequence lists or programs from the memory 20. This programming allows different bus communication protocols to be used, for example.

The connecting port 4 can be addressed in three different ways. First, access can be effected from the port control unit 18, which serves as an interface for the functional circuit core 3.

A corresponding functional circuit core 3, for example a controller, transfers a relative destination address to the port control unit 18 acting as interface. A corresponding control unit in the interface for the functional circuit core decides on the basis of its programming, the direction (horizontally or vertically) in which the data link to the destination address is set up. This reveals which of the four connecting ports 4, 5, 6, 7 are used as starting ports. The corresponding port control unit, in this exemplary instance 10, receives the destination address and control information via the port line 14. The multiplexer arrangement 25, under the control of the control unit 24, is used to supply the destination address and control information about the driver unit 22 to the connecting port 4 associated with the port control unit 10.

A second opportunity is provided by access from a connecting port 7, on the same electronic basic unit 2, to the connecting port 4 under consideration via the corresponding port control unit 13. In this case too, the address and control information is transmitted from a port control unit 13 via the port lines to the second port control unit 10, which forwards this information via the connecting port 4 to the respective adjacent electronic basic unit.

The third opportunity is provided by access to the connecting port 4 from another adjacent electronic basic unit. In this case, the address information is connected, under the control of the control unit 24, from the driver unit 22 to the address-matching unit 23, where the destination address is changed and forwarded to the multiplexer arrangement 25. The corresponding data and control information is always routed directly to the multiplexer arrangement 25 under the control of the control unit 24 and routed to one of the port control units 11, 12, 13, 18 on the basis of the manipulated or matched address information. The matching or manipulation of the received destination addresses in the address-matching unit 23 is explained in more detail below with reference to FIG. 4.

Figure 4:
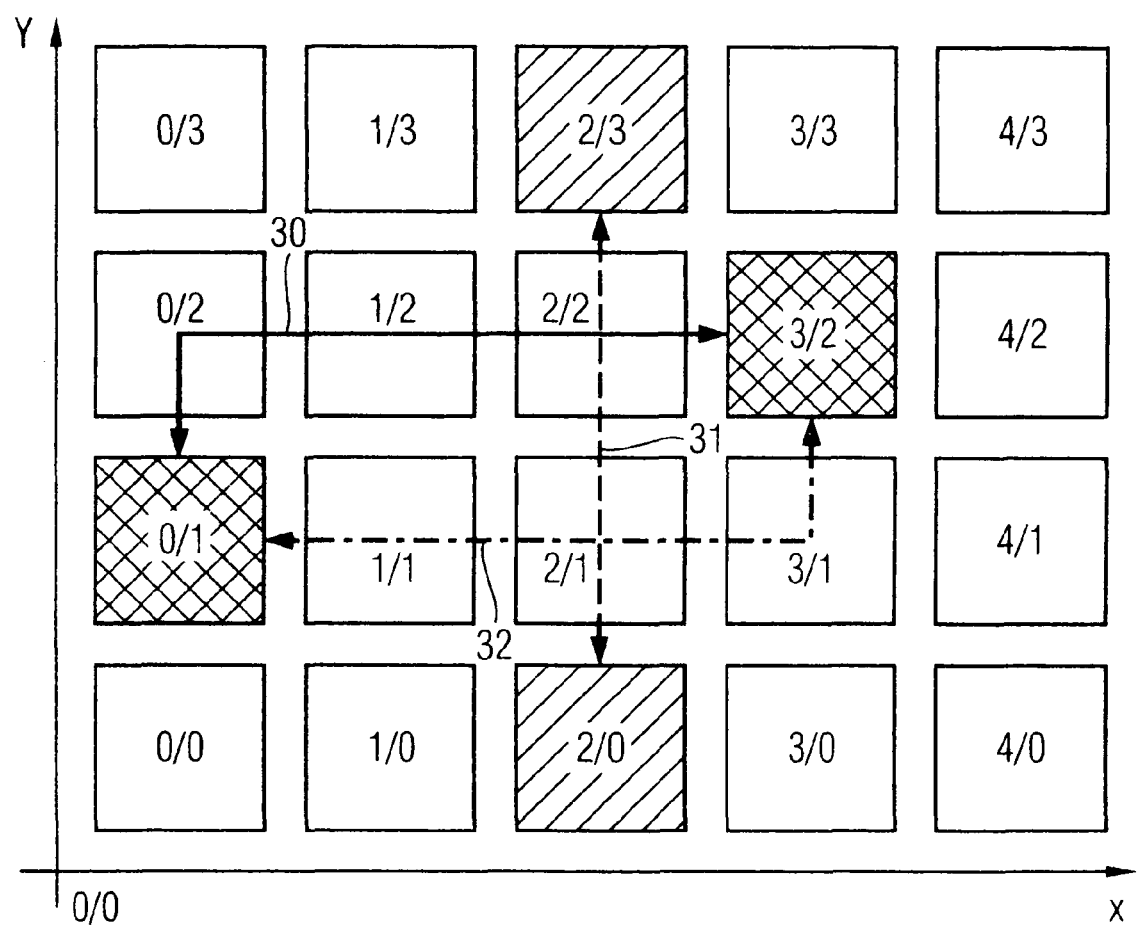
FIG. 4 is a diagram of the data transfer via the inventive bus system.

FIG. 4 shows an exemplary addressing diagram for the orthogonal bus system formed from inventive electronic basic units.

This contains a schematic arrangement of square electronic basic units in an XY grid. To simplify understanding, the electronic basic units have been provided with absolute address statements X/Y, with the first value indicating the position in the horizontal X grid system and the second value indicating the vertical position in the Y direction. The arrows shown denote exemplary signal paths or connecting paths 30, 31, 32.

Consideration will first of all be given to a data link from the electronic basic unit with the address 3/2 to the electronic basic unit with the address 0/1. For the bus protocol, the basically arbitrary option is chosen that horizontal connections, that is to say those running in the X direction, are made preferably and first. The relative destination address from the basic unit 3/2 to the basic unit 0/1 is −3/−1. The basic unit 3/2 transmits the address and data information via its left-hand connecting port to the basic unit 2/2 or its right-hand connecting port. The connecting-port controller in the basic unit 2/2 or the corresponding port control unit 10, as is shown in FIGS. 2 and 3, for example, changes the relative destination address data to −2/−1 using the respective address-matching unit 23 which is provided. The corresponding control unit 24 at the (absolute) address 2/2 checks whether the horizontal component of the relative destination address is not equal to zero and, in the situation which now applies, prompts the changed relative destination address data and data about internal port lines in the basic unit to be supplied to the left-hand connecting port, which is denoted by the reference symbol 6 in FIG. 2. The address data reach the basic unit 1/2 which is adjacent to this connecting port 6 and in which an address-matching unit again changes the relative destination address to −1/−1. The address, data and control information is then supplied to the connecting port between the basic units 0/2 and 1/2. In the basic unit 0/2, the destination address information is adjusted to 0/−1.

Since the address information for the horizontal now yields zero, the direction in which the data transfer takes place changes to vertical. This is done by a corresponding connecting-port controller within the electronic basic unit 0/2. This results in the address and data information being transmitted in a negative vertical direction from the lower connecting port on the basic unit 0/2 to the upper connecting port on the basic unit 0/1, which is simultaneously the destination unit. In the basic unit 0/−1, the respective upper connecting port or the corresponding port control unit changes the relative destination address to 0/0. This is recognized by a corresponding control unit in the electronic basic unit 0/1, which therefore terminates the routing process or connection setup process and makes the connection to the functional core of the basic unit 0/1 via the corresponding port control unit. The corresponding handshake lines of the port lines, which are denoted by 4-2 in FIG. 3, for example, are used to initiate a handshake between the connecting-port controllers in the basic units 3/2 and 0/1, as a result of which the data link is ultimately set up.

The relevant signal path via the orthogonal bus in the case of a bus configuration in which vertical signal paths are initially processed is described by the arrow 32 between the basic units 3/2 and 0/1 using the connecting ports and connecting-port controllers in the basic units 1/1, 2/1 and 3/1.

In parallel with the data link between 3/2 and 0/1 in line with the path 30, it is possible to use the basic unit 2/2 to set up a connection between the basic units 2/3 and 2/0, since only then are all four connecting ports in use.

The inventive form of the electronic basic units with their connecting ports and the connecting-port controllers allows simple communication between the functional circuit cores of the electronic basic units via the orthogonal bus system. A system on chip of such a design requires no exposure masks to form wiring for the entire SoC, but rather continues to allow the use of the individual mask arrangements for the electronic basic units in a production method. This makes it possible to modify the entire SoC without any great development or production complexity, since the wiring is effected under program control.

Figure 5:
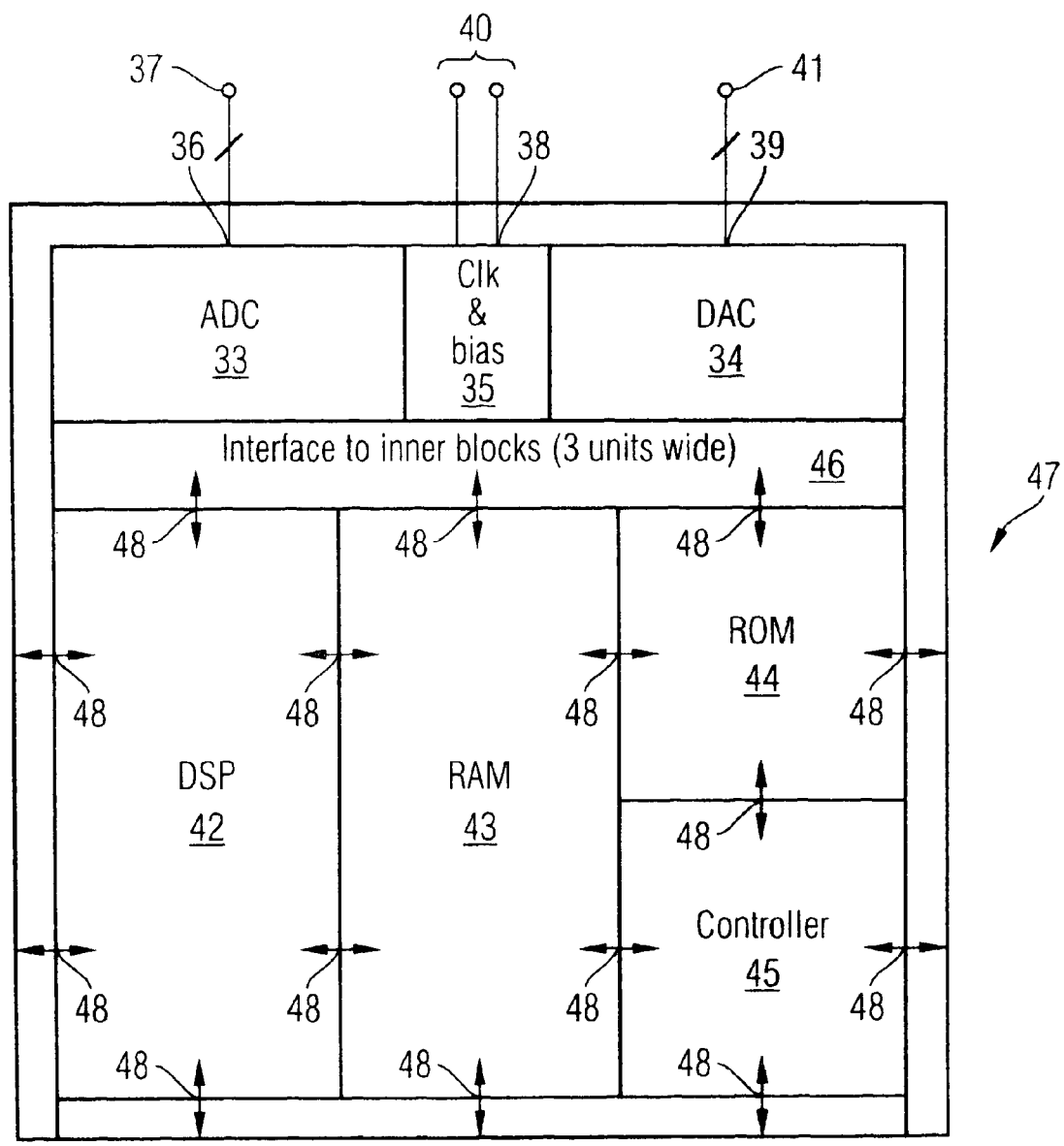
FIG. 5 is an exemplary embodiment of an inventive system on chip.

FIG. 5 shows an exemplary embodiment of an inventive system on chip.

In this case, the system requirements demanded by way of example include analogue/digital conversion, digital/analogue conversion, digital filtering, data processing, control of the SoC state and communication with a host system. For these requirements, functional circuit cores for analogue/digital converters, digital/analogue converters, digital signal processors (DSPs), volatile RAM and non-volatile ROM stores and microcontrollers are needed.

As FIG. 5 shows, a basic unit 33 in the form of an analogue/digital converter, a basic unit 34 in the form of a digital/analogue converter and a clock and supply voltage unit 35 form an analogue front end of the system on chip. The electronic basic unit 33 in the form of an analogue/digital converter has a peripheral interface 36 with connection pads 37 for connection to external electronic circuits. Corresponding interfaces 38, 39 and connection pads 40, 41 also have the clock and supply voltage unit 35 and the digital/analogue converter basic unit 34.

This analogue front end formed from the three electronic basic units 33, 35, 34 is adjoined by a basic unit 46 as an interface to the further electronic basic units. A DSP basic unit 42 is provided, for example for filtering, Fourier transformation or further signal processing for the digital data provided by the analogue/digital converter 33. These digital data are provided via the interface basic unit 46 using the bus system provided by the connecting ports 48. There is also provided a RAM store in the form of the electronic basic unit 43 for the DSP and the functional circuit core of the electronic basic unit 45, which forms a microcontroller. In addition, a non-volatile ROM store is in the form of a functional core of the electronic basic unit 44.

All the electronic basic units are coupled to one another via inventive connecting ports 48, so that data interchange can take place via the bus system formed in this manner, for example using the protocol explained with reference to FIG. 4. The ROM store 44 contains, by way of example, the connection data from all the functional circuit cores about the connecting ports with one another and/or further program components for performance of the relevant system task by the controller 45 and the DSP 42.

An inventive geometric basic shape for an SoC of this type may be one square millimeter, for example, for known 0.18 or 0.13 micron technology. It is thus possible to provide 12 or 16 input and output connection pads over a length of 1 mm. To create a 16-bit input and output connection, it is then necessary to have peripheral interfaces with the width of at least 2 mm in order to provide a 16-bit input and output bus. The example shown in FIG. 5 can thus be implemented on a 3-mm-wide subsection of a semiconductor substrate, for example.

The present invention is used to design systems on chip using the inventive electronic basic units and provides a production method which is appropriate for this purpose. In this case, the inventive standard for the electronic basic units or modules allows simple development of systems on chip by putting together an SoC from a mask library for different electronic basic units with various functional circuit cores.

A particular advantage in this context is that the mask production needs to be performed only for the electronic basic units and these standard masks are used for manufacturing the SoC. This means that there is more flexibility in the design of further SoCs with just a few modified functions than when producing SoCs based on the prior art. The inventively provided connection structure with connecting ports makes it possible to achieve a simple orthogonal bus system, which means that practically any wiring arrangements or data transfers between functional module cores or functional circuit cores also become possible. By choosing this standard geometry as a geometric basic shape, it is also a simple matter to produce SoCs on semiconductor substrates.

Although the present invention has been explained with reference to the exemplary embodiments illustrated in the figures, it is not limited thereto but rather can be modified in a wide variety of ways. By way of example, a geometric basic shape does not necessarily have to be in the form of a square or rectangle.

Other geometries such as triangles or less regular geometric shapes suitable for covering an area of the semiconductor substrate are also possible. It is also possible to provide any number of connecting ports at the edges of the electronic basic units. In addition, obvious further bus protocols for providing data transfer connections between non-adjacent electronic basic units in an SoC are possible using the inventive data bus comprising connecting ports and connecting-port controllers.

Although modifications and changes may be suggested by those skilled in the art, it is the intention of the inventor to embody within the patent warranted heron all changes and modifications as reasonably and properly come within the scope of his contribution to the art.

I claim as my invention:

1. An electronic basic unit for a system on chip, comprising:

a semiconductor substrate; said electronic basic unit being formed on said semiconductor substrate and having the form of an integrated circuit;

an area on said semiconductor substrate; said area being bounded by a geometric basic shape;

a functional circuit core which determines a function for said electronic basic unit;

at least two connecting ports at the edges of said geometric basic shape; said at least two connecting ports each being designed to be directly electrically coupled to a further connecting port of a further electronic basic unit produced on said semiconductor substrate and being adjacent to said electronic basic unit; and at least two programmable connecting-port controllers, each programmable connecting-port controller being connected to one of the connecting ports for controlling data transfers between said electronic basic unit and said further electronic basic units produced on said semiconductor substrate via said at least two connecting ports;

wherein said data transfers between said electronic basic units are effected by the respective of said connecting-port controllers using relative addresses.

2. The electronic basic unit of claim 1, wherein said geometric basic shape is so that an area on said semiconductor substrate can be inlaid with it.

3. The electronic basic unit of claim 2, wherein said geometric basic shape is a rectangle.

4. The electronic basic unit of claim 3, wherein on each side of said rectangle is provided at least one of said at least one connecting ports.

5. The electronic basic unit of claim 1, comprising a peripheral interface having connection pads for connection to external electronic circuits.

6. The electronic basic unit of claim 1, comprising an internal clock generator.

7. The electronic basic unit of claim 1, wherein said connecting-port controller connects incoming data to said functional circuit core or to another connecting port of said electronic basic unit.

8. The electronic basic unit of claim 1, wherein said connecting-port controller comprises a memory for holding connection data.

9. The electronic base unit of claim 1, wherein said functional circuit core is one of a microprocessor, a memory, a digital signal processor, an analogue-digital converter, and a digital-analogue converter.

10. A system on chip comprising a plurality of electronic basic units; each of said electronic basic units comprising:

a semiconductor substrate; said each electronic basic unit being formed on said semiconductor substrate and having the form of an integrated circuit;

an area on said semiconductor substrate; said area being bounded by a geometric basic shape;

a functional circuit core which determines a function for said electronic basic unit;

at least two connecting ports at the edges of said geometric basic shape; said at least two connecting ports being each designed to be directly electrically coupled to a further connecting port of a further electronic basic unit produced on said semiconductor substrate and being adjacent to said electronic basic unit; and at least two programmable connecting-port controllers, each being connected to one of the connecting ports for controlling data transfers between said each electronic basic unit and said further electronic basic units produced on said semiconductor substrate via said at least two connecting ports;

said plurality of electronic basic units being commonly provided on said semiconductor substrate and being in a form such that the edges of adjacent of said electronic basic units and their respective of said connecting ports couple to one another;

wherein said data transfers between said electronic basic units are effected by the respective of said connecting-port controllers using relative addresses.

11. The system on chip of claim 10, wherein said connecting ports and said connecting-port controllers form an orthogonal bus system for the system on chip.

12. The system on chip of claim 11, wherein said connecting ports are provided in one plane of said system on chip for said electronic basic units.

13. The system on chip of claim 10, wherein said data transfers between said electronic basic units take place asynchronously.

14. The system on chip of claim 10, wherein at least one of said electronic basic units comprises a multiple of the area of said geometric basic shape.

* * * * *